(12) United States Patent
Alshinnawi et al.

(10) Patent No.: US 9,137,930 B2
(45) Date of Patent: Sep. 15, 2015

(54) PROTECTING DEVICES AGAINST HOT AIR BACKFLOW IN A COMPUTER SYSTEM RACK HAVING A REAR DOOR HEAT EXCHANGER

(71) Applicant: International Business Machines Corporation, Armonk, NY (US)

(72) Inventors: Shareef F. Alshinnawi, Durham, NC (US); Gary D. Cudak, Creedmoor, NC (US); Robert W. Stegner, Raleigh, NC (US); Edward S. Suffern, Chapel Hill, NC (US); J. Mark Weber, Wake Forest, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 366 days.

(21) Appl. No.: 13/903,436

(22) Filed: May 28, 2013

(65) Prior Publication Data
US 2014/0355201 A1 Dec. 4, 2014

(51) Int. Cl.
| | |
|---|---|
| G01M 1/38 | (2006.01) |
| G05B 13/00 | (2006.01) |
| G05B 15/00 | (2006.01) |
| G05D 23/00 | (2006.01) |
| G05D 15/00 | (2006.01) |
| G05D 16/00 | (2006.01) |
| H05K 5/00 | (2006.01) |
| H05K 7/00 | (2006.01) |
| G06F 1/16 | (2006.01) |
| G06F 1/20 | (2006.01) |
| H05K 7/20 | (2006.01) |

(52) U.S. Cl.
CPC ........ H05K 7/20745 (2013.01); H05K 7/20736 (2013.01)

(58) Field of Classification Search
CPC . H05K 7/20; H05K 7/20709; H05K 7/20572; H05K 7/20581; H05K 7/20827
USPC ............ 361/679.01, 679.02, 679.51, 679.48, 361/679.46, 724; 700/275, 282, 299, 300; 165/283
See application file for complete search history.

(56) References Cited

U.S. PATENT DOCUMENTS

| | | | |
|---|---|---|---|
| 4,232,698 | A | 11/1980 | Hosterman et al. |
| 6,414,828 | B1 | 7/2002 | Zimmerman et al. |
| 7,031,154 | B2 | 4/2006 | Bash et al. |
| 7,079,387 | B2 | 7/2006 | Brooks et al. |
| 7,447,022 | B2 | 11/2008 | Murakami et al. |

(Continued)

OTHER PUBLICATIONS

Greenheck, "Backdraft & Pressure Relief Dampers" Greenheck Fan Corporation, Dec. 2010, 00.DMP.1012 R2 Dec. 2010, 12 pages.

(Continued)

*Primary Examiner* — Ronald Hartman, Jr.
(74) *Attorney, Agent, or Firm* — Katherine S. Brown; Jeffrey L. Streets

(57) ABSTRACT

A rear door heat exchanger is used to cool exhaust air as it exits a rack containing a plurality of computing devices. An air flow rate is determined for each of the plurality of computing devices within the rack, wherein each of the plurality of computing devices includes a fan drawing air through the computing device. The position of a baffle or louver is controlled to allow exhaust air to bypass the rear door heat exchanger in response to determining that the total air flow rate through the plurality of computing devices exceeds a predetermined air flow capacity threshold of the rear door heat exchanger.

15 Claims, 4 Drawing Sheets

(56) References Cited

U.S. PATENT DOCUMENTS

| | | | |
|---|---|---|---|
| 7,534,167 B2* | 5/2009 | Day | 454/187 |
| 7,548,170 B1 | 6/2009 | Griffel et al. | |
| 7,657,347 B2* | 2/2010 | Campbell et al. | 700/300 |
| 7,707,880 B2* | 5/2010 | Campbell et al. | 73/202.5 |
| 7,757,506 B2* | 7/2010 | Ellsworth et al. | 62/259.2 |
| 7,800,902 B2 | 9/2010 | Della Fiora et al. | |
| 7,905,096 B1* | 3/2011 | Campbell et al. | 62/93 |
| 8,028,793 B2* | 10/2011 | Bard | 181/198 |
| 8,154,870 B1 | 4/2012 | Czamara et al. | |
| 8,259,449 B2* | 9/2012 | Novotny et al. | 361/696 |
| 8,270,155 B2 | 9/2012 | Tipley | |
| 8,817,474 B2* | 8/2014 | Campbell et al. | 361/699 |
| 8,857,057 B2* | 10/2014 | Campbell et al. | 29/890.031 |
| 2002/0149911 A1 | 10/2002 | Bishop et al. | |
| 2007/0097636 A1 | 5/2007 | Johnson et al. | |
| 2009/0205416 A1* | 8/2009 | Campbell et al. | 73/202.5 |
| 2011/0292593 A1* | 12/2011 | June et al. | 361/679.47 |
| 2012/0008275 A1 | 1/2012 | Doll et al. | |
| 2012/0033379 A1 | 2/2012 | Lam et al. | |
| 2012/0037353 A1 | 2/2012 | Coors | |
| 2012/0298338 A1* | 11/2012 | Iyengar et al. | 165/104.31 |
| 2013/0299137 A1* | 11/2013 | Iyengar et al. | 165/104.33 |

OTHER PUBLICATIONS

Subsea Oil & Gas "Non-Return/Pressure Relief Damper Product Spec—Parallel Blade Motion" http://www.subsea.org/products/specification.asp?prod=5040, Non-Return/ Pressure Relief Damper Product from Wozair Limited for Subsea Oil Gas Application, Feb. 8, 2013, 2 pages.

* cited by examiner

PROTECTING DEVICES AGAINST HOT AIR BACKFLOW IN A COMPUTER SYSTEM RACK HAVING A REAR DOOR HEAT EXCHANGER

BACKGROUND

1. Field of the Invention

The present invention relates to a computer system rack having a rear door heat exchanger and methods of using a rear door heat exchanger.

2. Background of the Related Art

Computer systems use electrical energy and produce heat as a byproduct of electrical resistance. Rack-based computer systems include many rack-mounted components in a high-density arrangement, which can produce a considerable amount of heat. Excess heat must be removed from the rack to control internal temperatures and to maintain system reliability, performance, and longevity. In a conventional rack-based computer system, rack-mounted fans move cool air through the rack to remove the excess heat and cool the components. The heated exhaust air must then be transported to a computer-room air conditioner ("CRAC") that cools the air before returning the cooled air to the data center.

In a conventional datacenter layout, racks in a data center are commonly arranged in an organized hot-aisle/cold-aisle layout to minimize the likelihood that appreciable volumes of heated exhaust air will directly re-entering the racks. A hot-aisle/cold-aisle layout may include alternating hot aisles and cold aisles, with the front of each rack sharing a cold aisle with one adjacent rack and the rear of each rack sharing a hot aisle with another adjacent rack. The CRAC supplies the cooled air to the cold aisles. The air from the cool aisle is drawn into the front of each rack and the heated air is exhausted through the rear of the rack to the hot aisle. The heated exhaust air recirculates through the CRAC to be cooled and returned back to the cold aisles.

Additional cooling capacity may be added to a data center using a rear door heat exchanger. A rear door heat exchange is typically secured to the back side of a computer system rack and uses a liquid, such as water, as a cooling fluid that is passed through one or more fin tubes. Hot exhaust air from exiting the rack passes over and through the fins so that heat energy is transferred from the air to the liquid. In addition to providing more cooling capacity, the use of a rear door heat exchanger may facilitate data center configurations other than the conventional hot-aisle/cold-aisle configuration.

BRIEF SUMMARY

One embodiment of the present invention provides a method, comprising use of a rear door heat exchanger to cool exhaust air as it exits a rack containing a plurality of computing devices, and determining an air flow rate for each of the plurality of computing devices within the rack, wherein each of the plurality of computing devices includes a fan drawing air through the computing device. The position of a baffle is controlled to allow exhaust air to bypass the rear door heat exchanger through the baffle in response to a total air flow rate through the plurality of computing devices exceeding a predetermined air flow capacity threshold of the rear door heat exchanger.

DETAILED DESCRIPTION

Figure 1:
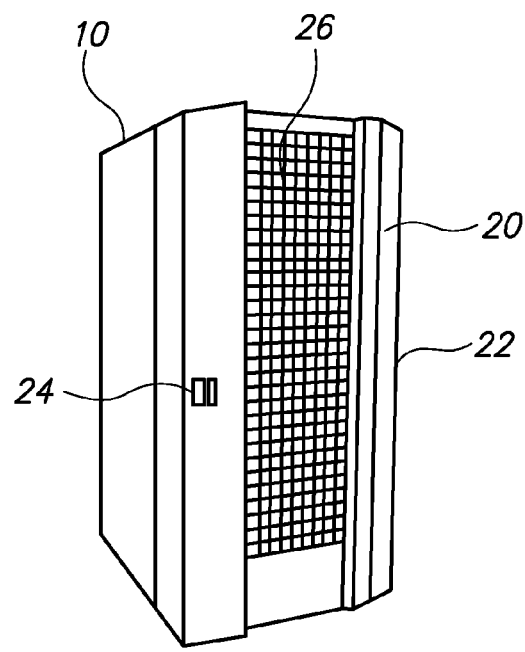
FIG. 1 is a perspective view of a rear door heat exchanger secured to a rack.

One embodiment of the present invention provides a method, comprising use of a rear door heat exchanger to cool exhaust air as it exits a rack containing a plurality of computing devices, and determining an air flow rate for each of the plurality of computing devices within the rack, wherein each of the plurality of computing devices includes a fan drawing air through the computing device. The position of a baffle is controlled to allow exhaust air to bypass the rear door heat exchanger through the baffle in response to a total air flow rate through the plurality of computing devices exceeding a predetermined air flow capacity threshold of the rear door heat exchanger.

A rear door heat exchanger typically includes, for example, a plurality of fin tubes arranged across a substantial portion of the rear door. Exhaust air from the computing devices is directed toward the rear of the rack and is cooled as it passes across the fins of the fin tubes. A cooling fluid, such as water, is circulated within the tubes to absorb heat energy from the fins.

The rack typically contains a plurality of computing devices, which may be, for example, servers, switches, power supplies, storage devices, and management modules. These computing devices typically have one or more on-board fan to draw cool air into a housing and across heat-generating components within the housing before the warmed exhaust air is released to the rear of the housing. The fans cause an increase in air pressure near the outlet of the fans along the rear of the rack. The high pressure air in the rear of the rack will escape through one or more paths of least resistance. Most of the air passes through the rear door heat exchanger.

However, the present invention recognizes that the fin tube structure of the rear door heat exchanger has some impedance to air flow. As the rate of air flow from the computing devices increases, the air pressure in the rear of the rack (i.e., the "rack side" of the rear door heat exchanger) will rise. This higher air pressure can have the negative effect of causing a loss of cooling air flow and perhaps also backflow of warmed exhaust air affecting one or more of the computing devices. These negative effects are most likely to have an impact on computing devices having weaker fans or lower air flow output, such as may be measured in cubic feet per minute (CFM). Within the rack, computing devices that have high-CFM fans can force warmed exhaust air to backflow into other computing devices that have low-CFM fans. As a result, computing devices with the lowest airflow among the computing devices of a given rack may be at risk of overheating when the total airflow through the rack exceeds the air flow capacity of the rear door heat exchanger.

Embodiments of the present invention provide an automatically controllable baffle that can relieve air pressure in the rear of the rack to prevent one or more of the computing devices from overheating as the result of such backflow. In one specific embodiment, the position of the baffle is controlled to allow warmed exhaust air to bypass the rear door heat exchanger through the baffle in response to a total air flow rate through the plurality of computing devices exceeding a predetermined air flow capacity threshold of the rear door heat exchanger.

The baffle may be implemented as any of a variety of baffle configurations known in the art that are capable of moving between a closed position in which air is substantially prevented from passing through an opening and an open position in which air is substantially unimpeded from passing through the opening. For example, the baffle may comprise one or more louver that extends across an opening and is pivotably coupled adjacent the opening. An actuator, such as a step motor, may cause the one or more louver to open or close. Preferably, the actuator can move the baffle to a desired position and secure the baffle in that desired position. In baffle embodiments that are pivotally secured adjacent the opening, the baffle may be pivoted to a particular angle or percent open and the baffle position may be described as an angle. For example, a baffle may be fully closed when positioned at a 0-degree angle, and may be fully open when positioned at a 90-degree angle relative to a collar around the opening. Optionally, the baffle position may be controlled in steps, such as 5 degree angular steps. Furthermore, the position of the baffle may be controlled by a management entity providing a control signal to an actuator that positions the baffle.

The location of the baffle may also be varied so long as it serves as a bypass around the rear door heat exchanger. For example, the baffle may be disposed in the rear door heat exchanger. Locating the baffle in the rear door heat exchanger provides the benefit that the rack structure does not require modification. In an alternative example, the baffle may be disposed in the top of the rack near the rear so that the baffle is in direct communication with the hot exhaust air from the computing devices and relieves the air pressure on the "rack side" of the rear door heat exchanger. Optionally, the baffle may be directly coupled to a return air duct to an air conditioning system, such that the hot exhaust air in the rear of the rack is draw directly into the return air duct.

In one embodiment, the position of the baffle may be controlled as a function of the difference between the total air flow rate of the plurality of computing devices within the rack and the predetermined air flow capacity threshold of the rear door heat exchanger.

In another embodiment, the air flow rate for each of the plurality of computing devices is determined by a management entity that communicates with each computing device to obtain a current fan speed for the fan(s) included in each computing device. The management entity may determine the air flow rate through each computing device as a predetermined function of the fan speed. Optionally, the management entity may determine the total airflow rate through the plurality of computing devices within the rack by calculating the sum of the air flow rates for each of the plurality of computing devices. Still further, the management entity may determine whether the total airflow rate through the plurality of heat-generating devices exceeds a predetermined threshold airflow rate capacity of the rear door heat exchanger. A positive determination indicates that conditions exist which may cause backflow of hot exhaust air into one or more of the computing devices.

In yet another embodiment, vital product data for the computing devices within the rack may be used to identify a target computing device having a fan with the lowest air flow capacity or more than one target computing device having a fan with an air flow capacity below a threshold value. Alternatively, the target computing device may identified as the computing device having a fan with the lowest air flow speed or air pressure produced at the fan outlet. A target computing device is the mostly likely to experience overheating as a result of hot air backflow. Optionally, the management entity may monitor a temperature of the target computing device and control the position of the baffle to bypass air flow, or increase the amount of bypass air flow, in response to determining that the temperature of the target computing device is rising faster than a setpoint.

In a further option, the method may further include throttling one or more of the computing devices to reduce the total air flow rate through the plurality of computing devices. Throttling will reduce the load on the computing device and reduce the fan speed required to cool the computing device. Accordingly, the air flow rate through the one or more throttled computing devices will be reduced, and the total air flow rate through the plurality of computing devices will be reduced by the same amount. This will have the effect of reducing the air pressure in the rear of the rack and the tendency for hot exhaust air backflow into computing devices. In a separate option, the method may include throttling the target computing device(s) so that it is less likely to become overheated.

FIG. 1 is a perspective view of a rack 10 having a rear door heat exchanger 20 secured a rear side of the rack. The rear door heat exchanger 20 has a hinged edge 22 and a latch handle 24 near an opposing edge. As shown, the rear door heat exchanger 20 is in a closed (operating) position, such that hot exhaust air from inside the rack 10 is directed through a large region 26 spanned by a fin tubes.

Figure 2:
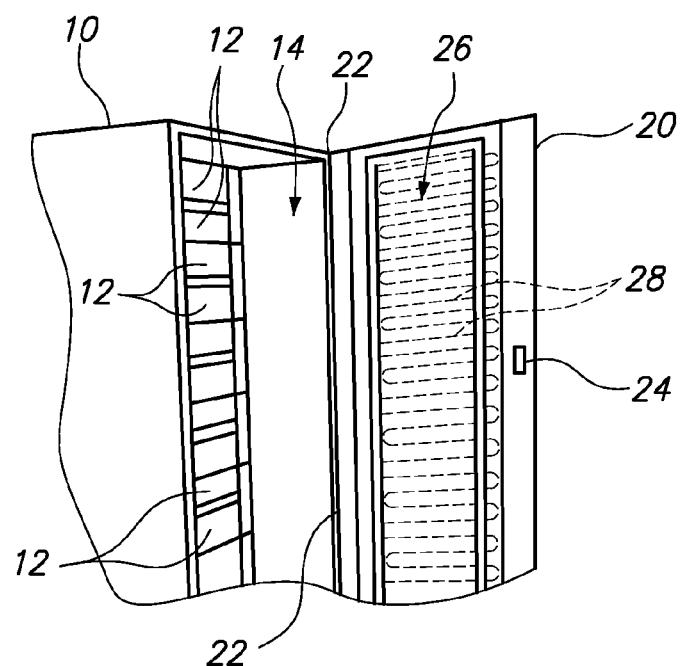
FIG. 2 is a partial perspective view of the rear door heat exchanger is an open position relative to the rack where computing devices are secured and operated.

FIG. 2 is a partial perspective view of the rear door heat exchanger 20 in an open position relative to the rack 10 where computing devices 12 are secured and operated. Air that has passed through the computing devices 12 is warmed, such that the hot exhaust air is released from the computing devices 12 in the open region 14 along the rear of the rack 10. After entering the open region 14, the air may then pass through the fin tubes 28 that span the region 26 of the rear door heat exchanger 20.

Figure 3:
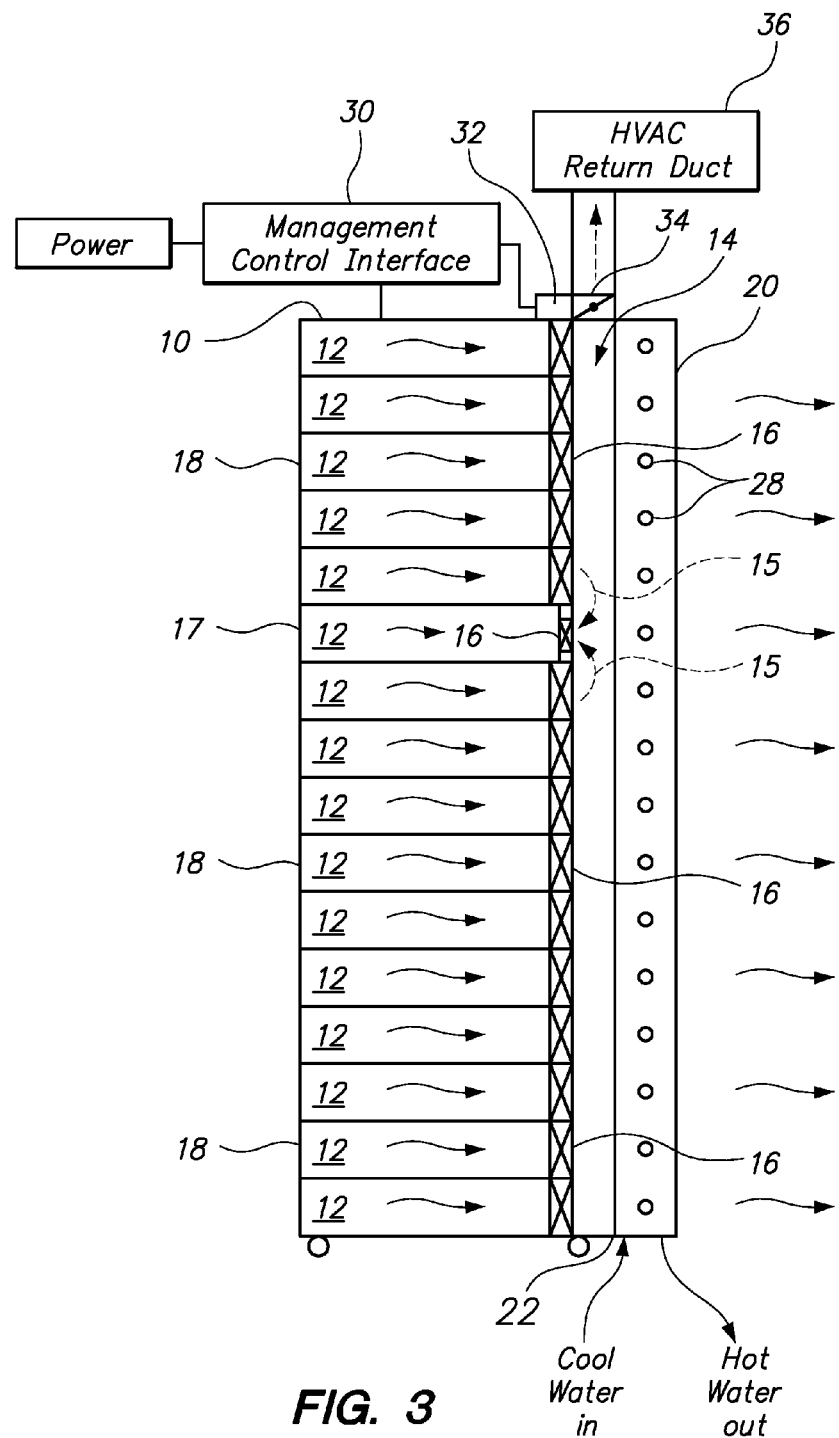
FIG. 3 is a schematic side view of a rack system according to one embodiment of the present invention.

FIG. 3 is a schematic side view of the rack 10 according to one embodiment of the present invention. The rack 10 supports a plurality of computing devices 12 in an orientation where the fans 16 draw in cool air through a front face 16 and release hot exhaust air into the open region 14 at the rear of the rack 10. As the hot exhaust air passes through the rear door heat exchanger 28, heat energy is transferred from the hot exhaust air into the fin tubes 28 and carried away in a circulating cooling fluid within the fin tubes 28.

When the total airflow through the plurality of computing devices 12 exceeds the airflow capacity of the rear door heat exchanger 20 some of the hot exhaust air may begin to backflow (represented by dashed arrows 15) into one or more of the computing devices 12. The computing device 17 (one of the computing devices 12) has a fan 16 that is smaller and less powerful than the rest of the fans 16. Accordingly, as the air pressure in the region 14 on the rack side of the rear door heat exchanger increases, some of the air in the region 14 will backflow into the computing device 17 before it will backflow into any of the other computing devices 12. Accordingly, computing device 17 may be considered to be a "target" computing device since the computing device 17 should be monitored as being at risk of overheating.

The management entity or management control interface 30 may communicate with each of the computing devices 12 to determine the airflow rate through each of the computing devices 12. Preferably, the management control interface 30 will also obtain vital product data for the fan(s) of each computing device 12 in order to identify which computing device 12 is most at risk of hot exhaust air backflow. The management control interface 30 may also monitor or collect device temperatures and/or air pressure measurements. When the management control interface 30 determines that conditions exist that would cause hot exhaust backflow into any one of the computing devices 12, then the management control interface 30 sends a signal to an actuator 32 to cause the baffle 34 to open and allow some of the hot exhaust air in region 14 to bypass the rear door heat exchanger 20. This reduces the air pressure in region 14 (the rear of the rack 10) so that no hot exhaust air backflow will occur. However, it is preferable to control the baffle position so that backflow is prevented while maximizing the amount of hot exhaust air that passed through the rear door heat exchanger 20. Optionally, the baffle 34 is coupled to a return air duct 36 that directs the hot exhaust air to an air conditioning unit (not shown).

Figure 4:
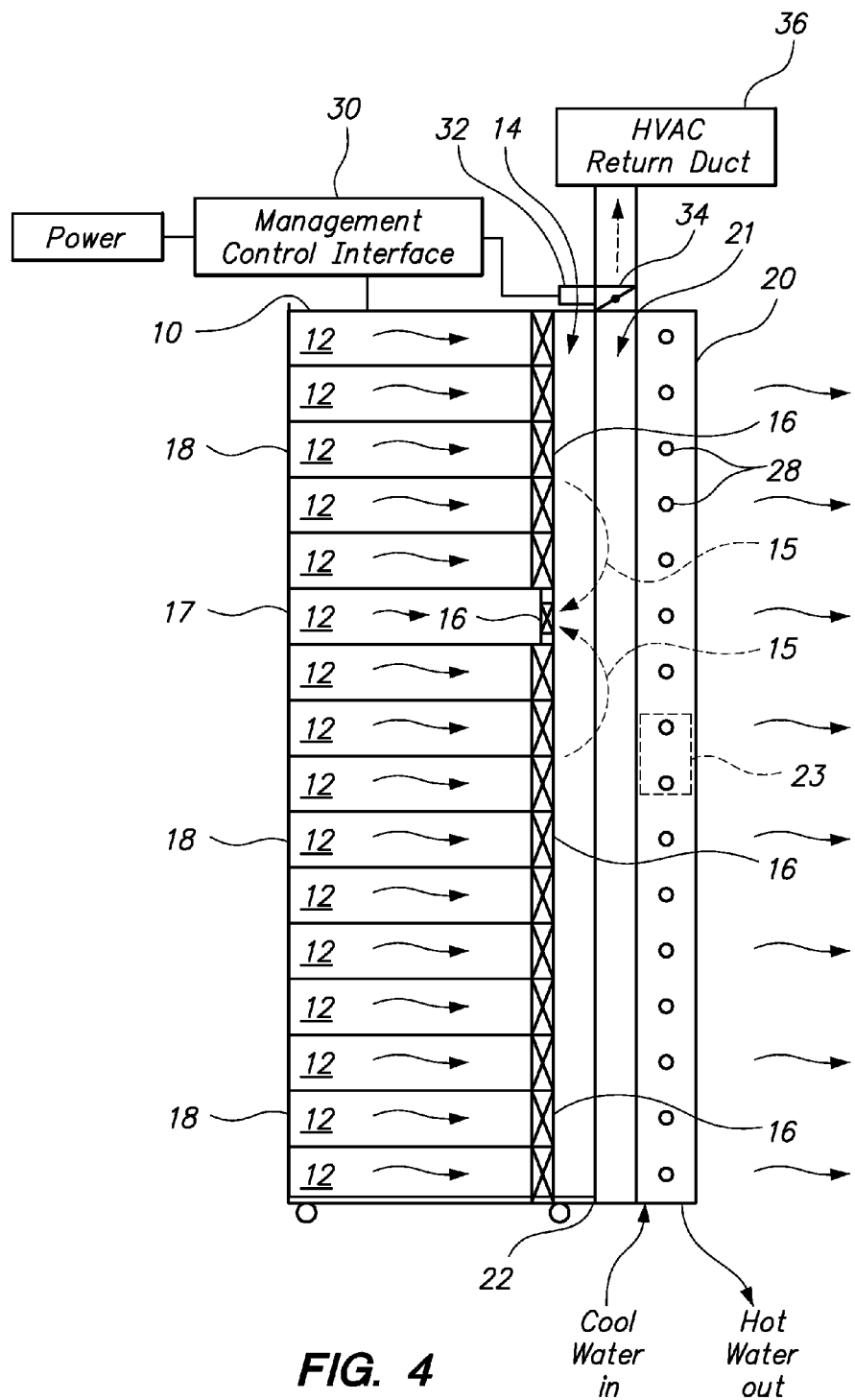
FIG. 4 is a schematic side view of a rack system according to another embodiment of the present invention.

FIG. 4 is a schematic side view of a rack system according to another embodiment of the present invention. The rack system in FIG. 4 is the same as that in FIG. 3, except that the rear door heat exchanger has a collared spacing area 21. Accordingly, the rear door heat exchanger 20 of FIG. 4 is hinged to the rack 10 along a vertical edge 22 such that the baffle 34 and actuator 32 move with the rear door heat exchanger 20. By contrast, the rear door heat exchanger 20 of FIG. 3 is hinged to the rack 10 along a vertical edge 22 such that the baffle 34 and actuator 32 are fixed to the rack 10. In accordance with the embodiment of FIG. 4, if the baffle 34 is coupled to an air duct 36, then a portion of the duct is preferably flexible to adjust as the rear door heat exchanger 20 is opened and closed. Furthermore, it should be recognized that the baffle 34, with or without an attached air duct, could optionally be located between some of the fin tubes 28, such as at a location 23 (shown in dashed lines).

Figure 5:
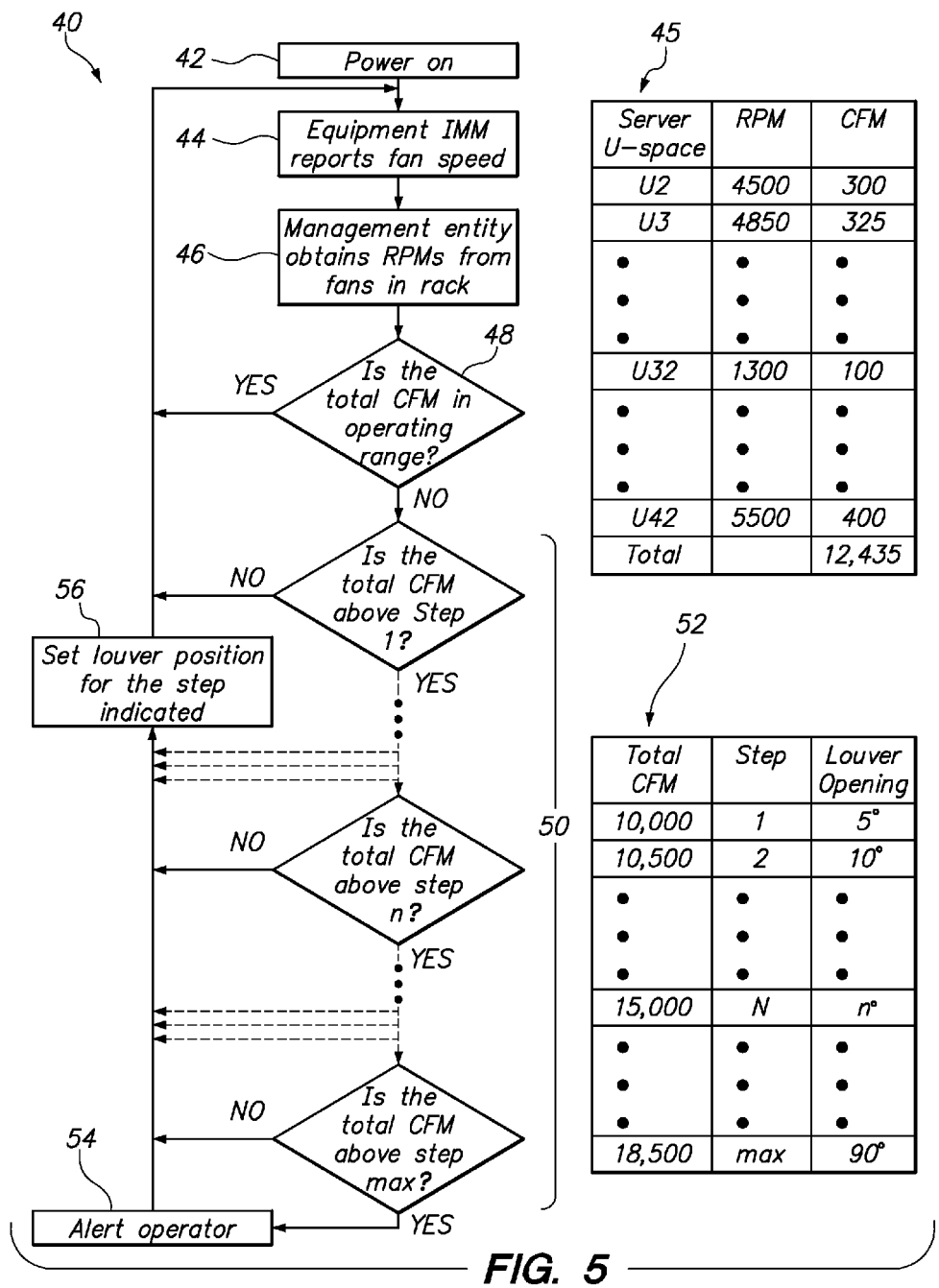
FIG. 5 is a flowchart of a method according to an embodiment of the present invention.

FIG. 5 is a flowchart of a method 40 according to an embodiment of the present invention. In step 42, computing device is powered on. In step 44, the integrated management module (IMM) or baseboard management controller (BMC) of each computing device reports the fan speed to the management entity or management control interface, such that the management entity obtains the fan speed from all of the fans in the rack in step 46. If the IMM has or obtains vital product data about the fan(s) in each computing device, then it can determine the air flow rate being generated by each fan. Accordingly, the management entity may accumulate the data shown in the first table 45. The first table 45 specifies, for each server U-space (each row of the first table 45), the speed of the fan in rotations-per-minute (RPM) and the associated air flow rate in cubic-feet-per-minute (CFM). In the example of the first table 45, the total air flow rate is shown at the bottom of the third column to be the sum of the air flow rates of the individual computing devices, such as 42 units of a 1U server.

In step 48, it is determined whether the total air flow rate (total CFM) through the rack is in a predetermined operating range, such as less than a predetermined air flow capacity of the rear door heat exchanger secured to the rack. If the total air flow rate is within the predetermined operating range, then method returns to step 44 in order to continue monitoring current speed of fans within the rack. If the total air flow rate is outside the predetermined operating range, i.e., exceeds the predetermined air flow capacity of the rear door heat exchanger secured to the rack, then the method proceeds to a series of steps 50 that determine how to position the louver. Any number of steps 50 or incremental louver steps may be used. In accordance with the example of the second table 52, the total air flow rate (CFM) through the rack (first column) is used as an index into the table 52 in order to determine how many steps (second column) that an actuator should use to open the louver, where those steps correspond to an angular orientation of the louver (third column). If the total air flow rate exceeds a maximum step, then an alert is triggered in step 54 to indicate to an operator that an emergency condition exists. However, after the appropriate louver step is determined in the series of steps 50, the method proceeds to step 56 send a control signal to a louver actuator so that the louver position is set to the step indicated.

As will be appreciated by one skilled in the art, the present invention may be embodied as a system, method or computer program product. Accordingly, the present invention may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, the present invention may take the form of a computer program product embodied in one or more computer-readable storage medium having computer-usable program code stored thereon.

Any combination of one or more computer usable or computer readable storage medium(s) may be utilized. The computer-usable or computer-readable storage medium may be, for example but not limited to, an electronic, magnetic, electromagnetic, or semiconductor apparatus or device. More specific examples (a non-exhaustive list) of the computer-readable medium include: a portable computer diskette, a hard disk, random access memory (RAM), read-only memory (ROM), an erasable programmable read-only memory (EPROM or Flash memory), a portable compact disc read-only memory (CD-ROM), an optical storage device, or a magnetic storage device. The computer-usable or computer-readable storage medium could even be paper or another suitable medium upon which the program is printed, as the program can be electronically captured via, for instance, optical scanning of the paper or other medium, then compiled, interpreted, or otherwise processed in a suitable manner, if necessary, and then stored in a computer memory. In the context of this document, a computer-usable or computer-readable storage medium may be any storage medium that can contain or store the program for use by a computer. Computer usable program code contained on the computer-usable storage medium may be communicated by a propagated data signal, either in baseband or as part of a carrier wave. The computer usable program code may be transmitted from one storage medium to another storage medium using any appropriate transmission medium, including but not limited to wireless, wireline, optical fiber cable, RF, etc.

Computer program code for carrying out operations of the present invention may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

The present invention is described below with reference to flowchart illustrations and/or block diagrams of methods, apparatus (systems) and computer program products according to embodiments of the invention. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored in a computer-readable storage medium that can direct a computer or other programmable data processing apparatus to function in a particular manner, such that the instructions stored in the computer-readable storage medium produce an article of manufacture including instruction means which implement the function/act specified in the flowchart and/or block diagram block or blocks.

The computer program instructions may also be loaded onto a computer or other programmable data processing apparatus to cause a series of operational steps to be performed on the computer or other programmable apparatus to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products according to various embodiments of the present invention. In this regard, each block in the flowchart or block diagrams may represent a module, segment, or portion of code, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. Each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A method, comprising:
   using a rear door heat exchanger to cool exhaust air as it exits a rack containing a plurality of computing devices;
   determining an air flow rate for each of the plurality of computing devices within the rack, wherein each of the plurality of computing devices includes a fan drawing air through the computing device; and
   controlling the position of a baffle to allow exhaust air to bypass the rear door heat exchanger through the baffle in response to a total air flow rate through the plurality of computing devices exceeding a predetermined air flow capacity threshold of the rear door heat exchanger.

2. The method of claim 1, further comprising:
   controlling the position of the baffle as a function of the difference between the total air flow rate of the plurality of computing devices within the rack and the predetermined air flow capacity threshold of the rear door heat exchanger.

3. The method of claim 2, wherein the position of the baffle is controlled in steps.

4. The method of claim 1, wherein determining an air flow rate for each of the plurality of computing devices includes a management entity communicating with each computing device to obtain a current fan speed for the fan included in each computing device and determining an air flow rate through each computing device as a predetermined function of the fan speed.

5. The method of claim 4, further comprising:
   the management entity determining the total airflow rate through the plurality of computing devices within the rack by calculating the sum of the air flow rates for each of the plurality of computing devices.

6. The method of claim 5, further comprising:
   the management entity determining whether the total airflow rate through the plurality of heat-generating devices exceeds a predetermined threshold airflow rate capacity of the rear door heat exchanger.

7. The method of claim 1, further comprising:
   using vital product data for the computing devices within the rack to identify a target computing device having a fan with the lowest air flow capacity.

8. The method of claim 7, further comprising:
   determining an amount of backflow pressure that a fan can overcome before backflow into the computing device will occur.

9. The method of claim 7, further comprising:
   the management entity monitoring a temperature of the target computing device and controlling the position of the baffle to bypass more air flow in response to determining that the temperature is rising faster than a setpoint.

10. The method of claim 1, wherein controlling the position of the baffle includes a management entity providing a control signal to an actuator that positions the baffle.

11. The method of claim 1, wherein the baffle is disposed in the rear door heat exchanger.

12. The method of claim 1, wherein the baffle is disposed in the top of the rack.

13. The method of claim 12, further comprising:
drawing exhaust air through the baffle directly into a return air duct to an air conditioning system.

14. The method of claim 1, further comprising:
throttling one or more of the computing devices to reduce the total air flow rate through the plurality of computing devices.

15. The method of claim 1, further comprising:
throttling one or more of the computing devices to reduce the air flow rate through the one or more computing devices.

* * * * *